(12) United States Patent
Ahn et al.

(10) Patent No.: US 11,171,183 B2
(45) Date of Patent: Nov. 9, 2021

(54) DISPLAY PANEL

(71) Applicant: Samsung Display Co., Ltd., Yongin-Si (KR)

(72) Inventors: Jeaheon Ahn, Hwaseong-si (KR); Jang-Il Kim, Asan-si (KR); Yeogeon Yoon, Suwon-si (KR); Seok-Joon Hong, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 65 days.

(21) Appl. No.: 16/688,996

(22) Filed: Nov. 19, 2019

(65) Prior Publication Data

US 2020/0219937 A1 Jul. 9, 2020

(30) Foreign Application Priority Data

Jan. 3, 2019 (KR) ........................ 10-2019-0000687

(51) Int. Cl.
  *H01L 27/32* (2006.01)
  *G02F 1/1335* (2006.01)
  *G02F 1/13357* (2006.01)
  *H01L 51/52* (2006.01)

(52) U.S. Cl.
  CPC ...... *H01L 27/322* (2013.01); *G02F 1/133514* (2013.01); *G02F 1/133617* (2013.01); *H01L 51/5284* (2013.01); *G02F 2202/36* (2013.01); *H01L 27/3244* (2013.01); *H01L 2251/5369* (2013.01)

(58) Field of Classification Search
  CPC ............... H01L 27/322; H01L 51/5284; H01L 27/3244; H01L 2251/5369; G02F 1/133514; G02F 1/133617; G02F 2202/36
  See application file for complete search history.

(56) References Cited

U.S. PATENT DOCUMENTS

| 9,680,054 B2 | 6/2017 | Coe-Sullivan et al. |
| 2010/0079704 A1* | 4/2010 | Cho ................... G02F 1/133617 349/71 |
| 2016/0070136 A1* | 3/2016 | Jang ...................... G02F 1/1336 349/61 |

FOREIGN PATENT DOCUMENTS

| KR | 10-2016-0077415 | 7/2016 |
| KR | 10-2017-0010931 | 2/2017 |
| KR | 10-2017-0064164 | 6/2017 |

\* cited by examiner

*Primary Examiner* — Stephen W Smoot
*Assistant Examiner* — Vicki B. Booker
(74) *Attorney, Agent, or Firm* — H.C. Park & Associates, PLC

(57) ABSTRACT

A display panel including: a first display substrate and a second display substrate. The second display substrate includes: a base substrate; a light control layer disposed on the base substrate and including a first conversion part configured to convert the first color light into a second color light, a second conversion part configured to convert the first color light into a third color light, and a transmission part configured to transmit the first color light; and a nano particle layer disposed between the base substrate and the light control layer and configured to absorb at least one of a first light having an overlapping wavelength range of a wavelength range of the first color and a wavelength range of the third color and a second light having an overlapping wavelength range of a wavelength range of the second color and a wavelength range of the third color.

19 Claims, 11 Drawing Sheets

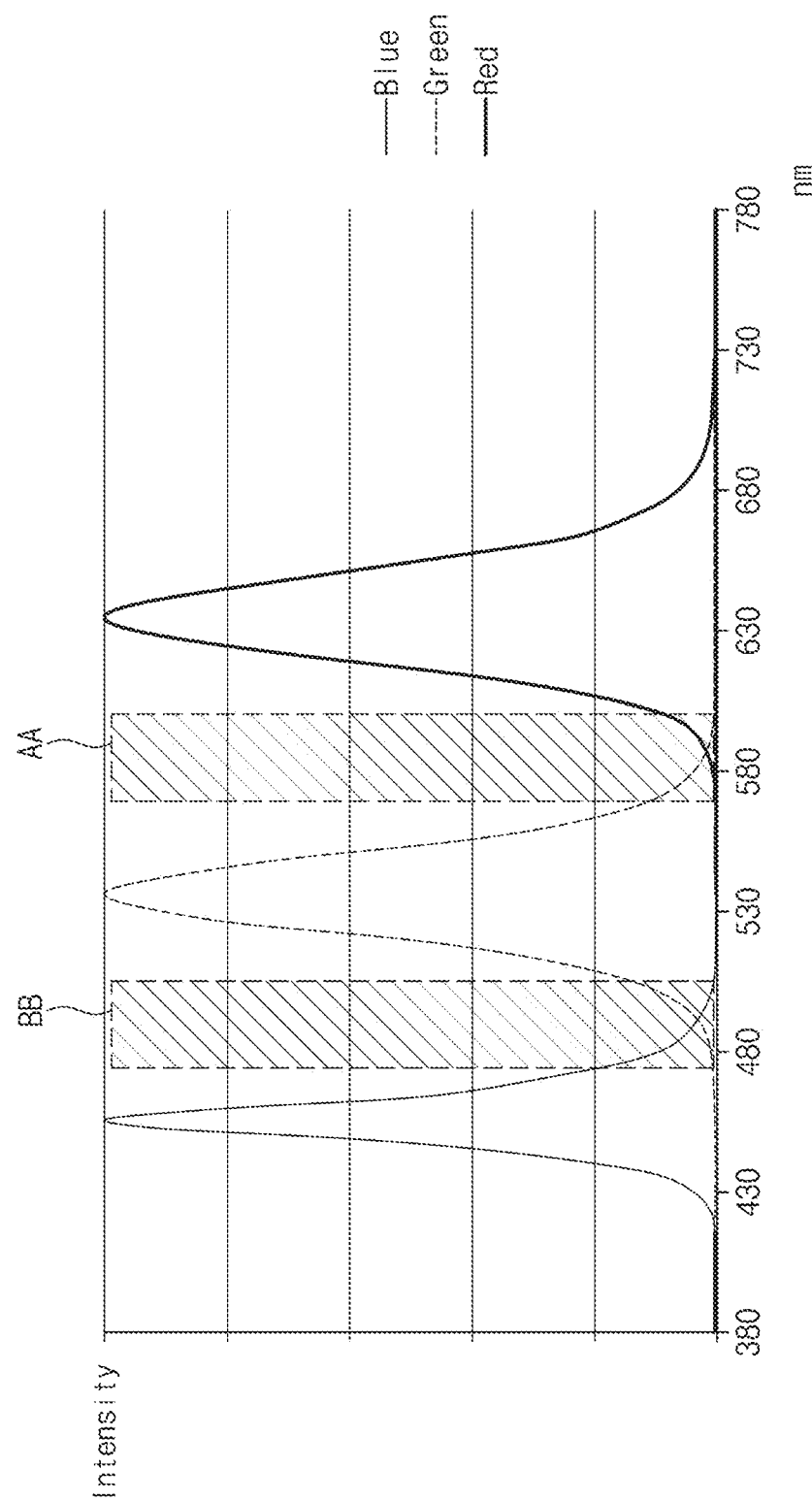

DISPLAY PANEL

CROSS REFERENCE TO RELATED APPLICATION

This application claims priority from and the benefit of Korean Patent Application No. 10-2019-0000687, filed on Jan. 3, 2019, which is hereby incorporated by reference for all purposes as if fully set forth herein.

BACKGROUND

Field

Exemplary embodiments of the invention relate generally to a display panel, and more specifically, to a display panel having improved visibility.

Discussion of the Background

Various display devices used for multi media devices, such as televisions, mobile phones, tablet computers, navigations, and game consoles, are being developed. In addition, recently, a Photo-Luminescent Liquid Crystal Display (LCD), which increases light utilization efficiency and improves color balance, is under development.

Various display devices have a problem of reflection and scattering of external light on the display surface when used in an outdoor environment with rich external light. For example, the color of some of the components included in the display device due to external light is visually recognized through the display surface.

The above information disclosed in this Background section is only for understanding of the background of the inventive concepts, and, therefore, it may contain information that does not constitute prior art.

SUMMARY

Exemplary embodiments of the invention provide a display panel capable of reducing external light reflections.

Additional features of the inventive concepts will be set forth in the description which follows, and in part will be apparent from the description, or may be learned by practice of the inventive concepts.

An exemplary embodiment of the invention provides a display panel including: a first display substrate including first to third light emitting elements for outputting first color light; and a second display substrate including first to third pixel areas overlapping the first to third light emitting elements, respectively. The second display substrate includes: a base substrate; a light control layer disposed on the base substrate and including a first conversion part configured to convert the first color light into a second color light different from the first color and emitting the second color light through the first pixel area, a second conversion part configured to convert the first color light into a third color light different from the second color light and emit the third color light through the second pixel area, and a transmission part configured to transmit the first color light and emit the first color light through the third pixel area; and a nano particle layer disposed between the base substrate and the light control layer and configured to absorb at least one of a first light having an overlapping wavelength range of a wavelength range of the first color and a wavelength range of the third color and a second light having an overlapping wavelength range of a wavelength range of the second color and a wavelength range of the third color.

The nano particle layer may include at least one first nanoparticle and at least one second nanoparticle, wherein the first nanoparticle may absorb the first light and the second nanoparticle absorbs the second light.

The nano particle layer may further include at least one third nanoparticle that absorbs third light in a wavelength range smaller than the wavelength range of the first color.

The nano particle layer may further include a base resin filled with the first nanoparticles and the second nanoparticles, wherein each of the first nanoparticle and the second nanoparticle may overlap the first to third pixel areas.

A size of the first nanoparticle may be larger than a size of the second nanoparticle.

The first conversion part may include a first illuminant and the second conversion part includes a second illuminant.

The first conversion part, the second conversion part, and the transmission part may be spaced apart from each other on a plane of the second display substrate, wherein on a plane, the second display substrate may further include a black matrix disposed between the first conversion part and the second conversion part, and between the second conversion part and the transmission part, and between the transmission part and the first conversion part.

The second display substrate may further include a color filter layer disposed between the nano particle layer and the light control layer.

The second display substrate may further include a low refractive layer disposed between the color filter layer and the light control layer.

A refractive index of the light control layer may be higher than a refractive index of the low refractive layer.

The color filter layer may include: a first color filter overlapping the first pixel area and having the second color; a second color filter overlapping the second pixel area and having the third color; and a third color filter overlapping the third pixel area and having the first color.

The nano particle layer may be disposed directly on the base substrate.

The first color may be blue, the second color may be red, and the third color may be green.

Each of the first to third light emitting elements may include a first electrode, a second electrode, and a light emitting layer disposed between the first electrode and the second electrode.

The light emitting layers of the first through third light emitting elements may be provided in an integral form.

The first display substrate may include: a lower base substrate; a circuit element layer disposed on the lower base substrate; and a display element layer disposed on the circuit element layer and including the light emitting elements.

Another exemplary embodiment of the invention provides a display panel including: a first display substrate including a plurality of light emitting elements for outputting first color light; and a second display substrate including a plurality of pixel areas overlapping the light emitting elements, respectively The second display substrate includes: a base substrate; a light control layer disposed on the base substrate and configured to convert the first color light into a second color light different from the first color, configured to convert the first color light into a third color light different from the second color light, and configured to transmit the first color light; and a nano particle layer disposed between the base substrate and the light control layer and configured to absorb at least one of a first light having an overlapping wavelength range of a wavelength range of the first color and a wavelength range of the third color and a second light having an overlapping wavelength range of a wavelength range of the second color and a wavelength range of the third color.

The nano particle layer may include a first nanoparticle that absorbs the first light, a second nano particle that absorbs the second light, and a third nano particle that absorbs light in a wavelength range shorter than the first color.

A diameter of the first nanoparticles may be larger than a diameter of the second nanoparticles and the diameter of the second nanoparticles may be larger than a diameter of the third nanoparticles.

It is to be understood that both the foregoing general description and the following detailed description are exemplary and explanatory and are intended to provide further explanation of the invention as claimed.

BRIEF DESCRIPTION OF THE FIGURES

The accompanying drawings, which are included to provide a further understanding of the invention and are incorporated in and constitute a part of this specification, illustrate exemplary embodiments of the invention, and together with the description serve to explain the inventive concepts.

FIG. 6B is a graph showing a wavelength range of light passing through a nano particle layer according to an exemplary embodiment of the invention.

DETAILED DESCRIPTION

Figure 1:
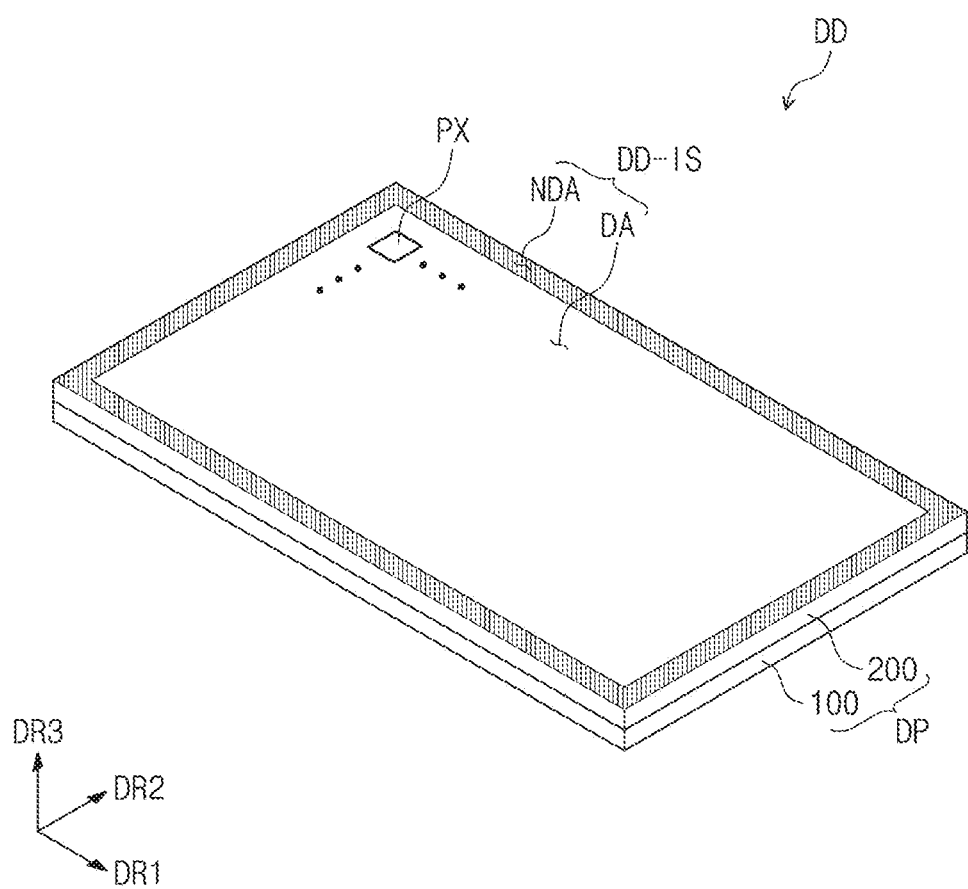
FIG. 1 is a perspective view of a display device according to an exemplary embodiment of the invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, an exemplary embodiment of the invention will be described with reference to the drawings.

Figure 2:
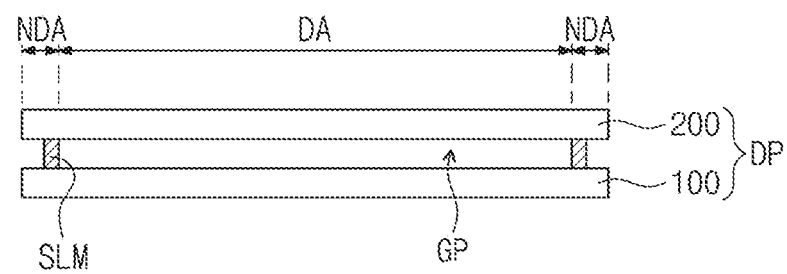
FIG. 2 is a cross-sectional view of a display panel according to an exemplary embodiment of the invention.
Figure 2:
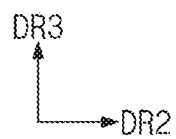

FIG. 1 is a perspective view of a display device according to an exemplary embodiment of the invention. FIG. 2 is a cross-sectional view of a display panel according to an exemplary embodiment of the invention.

The display device DD according to an exemplary embodiment of the invention may be used in medium-sized electronic devices, such as personal computers, notebook computers, personal digital terminals, car navigation units, game machines, smart phones, tablets, and cameras, in addition to large-sized electronic devices, such as monitors, or external billboards. In addition, these are merely examples and it is obvious that the display device DD may be employed in other electronic devices without departing from the scope of the inventive concept.

Referring to FIG. 1, the display device DD includes a display panel DP. The display panel DP may be one of a liquid crystal display panel, an electrophoretic display panel, a microelectromechanical system (MEMS) display panel) an electrowetting display panel, and an organic light emitting display panel, but is not particularly limited.

Although not shown separately, the display panel DP may further include a chassis member or a molding member, and may further include a backlight unit according to the type of the display panel DP.

The display panel DP may include a first display substrate 100 (or a lower display substrate) and a second display substrate 200 (or an upper display substrate) facing the first display substrate 100. As shown in FIG. 1, the display panel DP may display an image through the display surface DP-IS. The display surface DP-IS is parallel to the plane defined by the first direction DR1 and the second direction DR2.

The display surface DP-IS may include a display area DA and a non-display area NDA. The pixel PX is disposed in the display area DA and the pixel PX is not disposed in the non-display area NDA. The non-display area NDA is defined along the rim of the display surface DP-IS. The display area DA may be surrounded by the non-display area NDA.

The normal direction of the display surface DP-IS, that is, a thickness direction of the display panel DP, is indicated by a third direction DR3. In this specification, the meaning of "viewed on a plane or being on a plane" means that it is viewed in the third direction DR3. The front surface (or the upper surface) and the back surface (or lower surface) of each of the layers or units described below are distinguished by the third direction DR3. However, the directions that the first to third directions DR1, DR2, and DR3 indicate may be converted to other directions, for example, opposite directions, as a relative concept.

In one exemplary embodiment of the invention, a display panel DP having a planar display surface DP-IS is shown, but the inventive concept is not limited thereto. The display panel DP may include a curved display surface or a stereoscopic display surface. The stereoscopic display surface may include a plurality of display areas, indicating different directions.

Referring to FIG. 2, a predetermined cell gap GP may be formed between the first display substrate 100 and the second display substrate 200. The cell gap GP may be maintained by a sealant SLM coupling the first display substrate 100 and the second display substrate 200. The sealant SLM may include an organic bonding member or an inorganic bonding member. The sealant SLM may include frit.

Figure 3A:
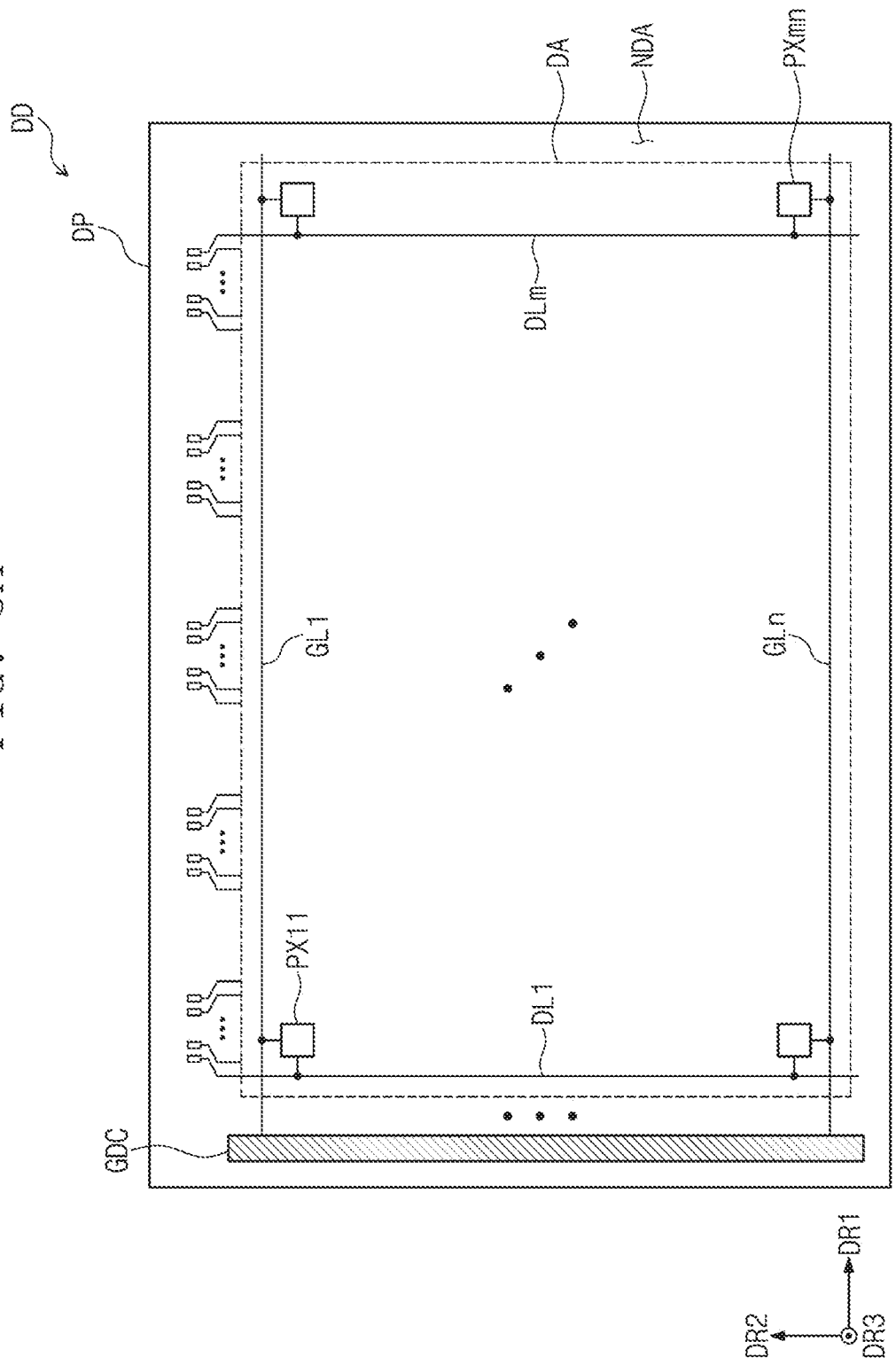
FIG. 3A is a plan view of a display device according to an exemplary embodiment of the invention.
Figure 3B:
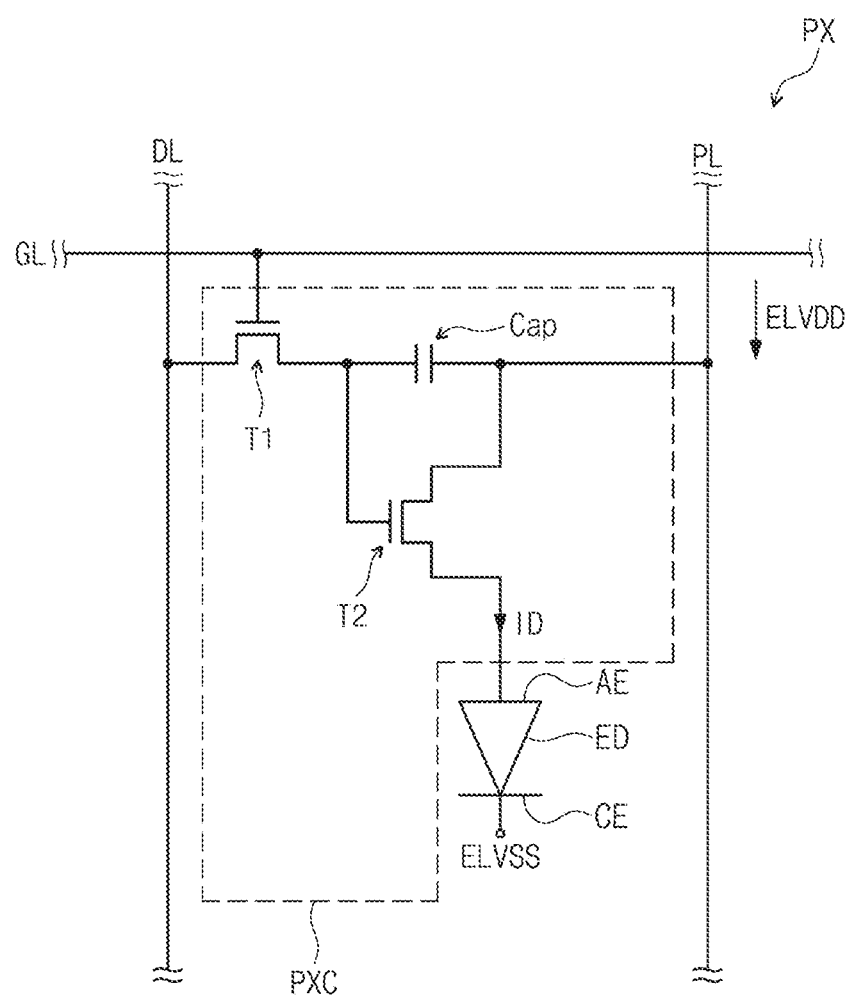
FIG. 3B is an equivalent circuit diagram of a pixel shown in FIG. 3A according to an exemplary embodiment of the invention.

FIG. 3A is a plan view of a display device according to an exemplary embodiment of the invention. FIG. 3B is an equivalent circuit diagram of a pixel shown in FIG. 3A according to an exemplary embodiment of the invention.

Referring to FIG. 3A, the arrangement relationship of the signal lines GL1 to GLn and DL1 to DLm and the pixels PX11 to PXmn on a plane is shown. The signal lines GL1 to GLn and DL1 to DLm may include a plurality of gate lines GL1 to GLn and a plurality of data lines DL1 to DLm.

Each of the pixels PX11 to PXmn is connected to a corresponding one of the plurality of gate lines GL1 to GLn and a corresponding one of the plurality of data lines DL1 to DLm. Each of the pixels PX11 to PXmn may include a pixel driving circuit and a display element. Depending on the configuration of the pixel driving circuit, more kinds of signal lines may be provided on the display panel DP.

The pixels PX11 to PXmn may be disposed in a matrix but are not limited to such an arrangement. The pixels PX11 to PXmn may be disposed in a PenTile™ form. The pixels PX11 to PXmn may be disposed in a diamond form.

The gate driving circuit GDC may be disposed in the non-display area NDA. The gate driving circuit GDC may be integrated into the display panel DP through an oxide silicon gate driver circuit (OSG) or an amorphous silicon gate driver circuit (ASG) process.

Referring to FIG. 3B, a pixel PX connected to one gate line GL, one data line DL, and one power supply line PL among the pixels PX11 to PXnm is illustratively shown in FIG. 3A. The configuration of the pixel PX is not limited thereto and may be modified and implemented.

According to the inventive concept shown in FIG. 3B, the pixel PX includes an organic light emitting element ED, a first electrode AE, a second electrode CE, and a pixel circuit PXC. The pixel PX includes the organic light emitting element ED as a display element.

Figure 5:
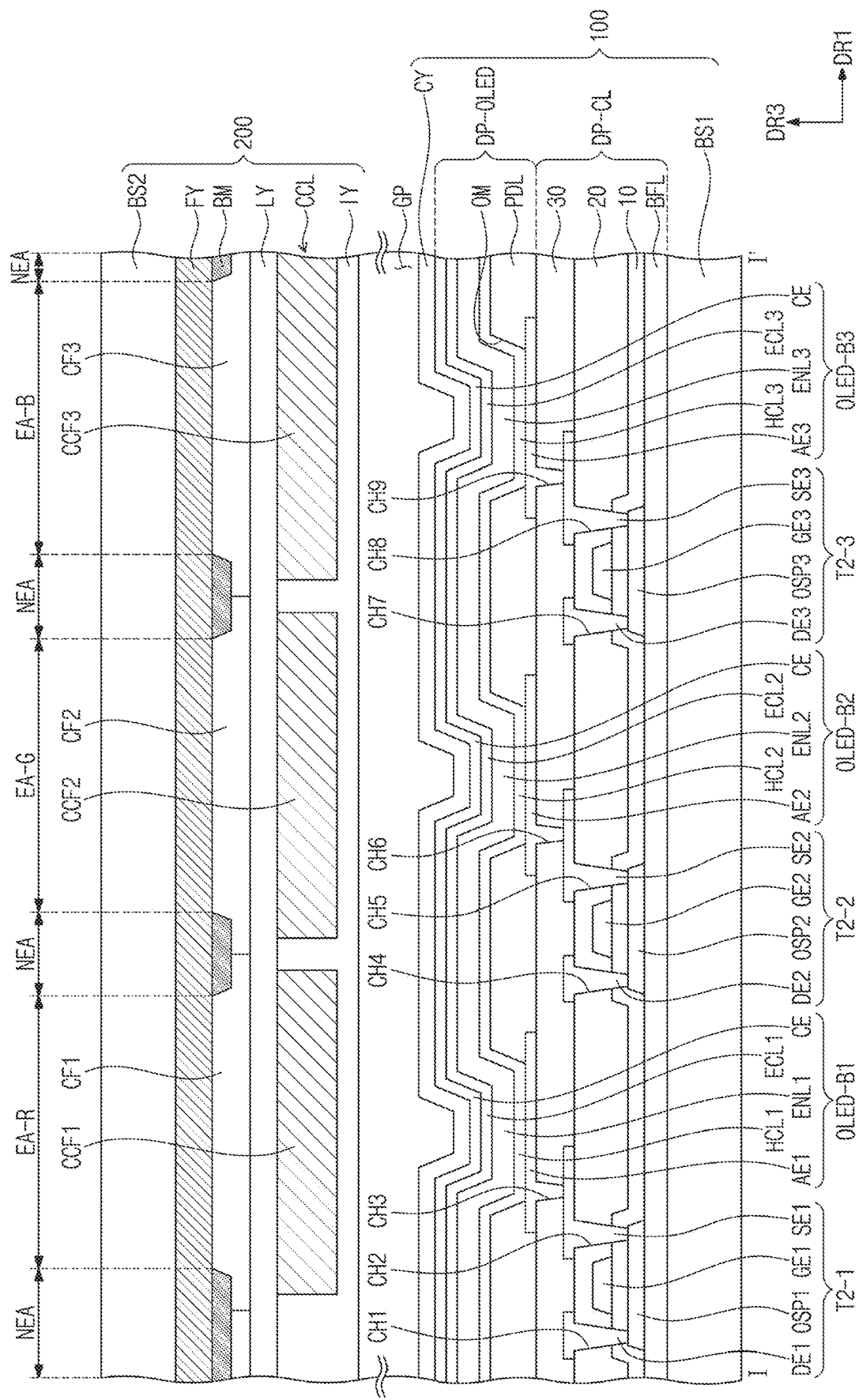
FIG. 5 is a cross-sectional view taken along line I-I' of FIG. 4A according to another exemplary embodiment of the invention.

The organic light emitting device ED, the first electrode AE, and the second electrode CE may be included in the display element layer DP-OLED (see FIG. 5). The pixel circuit PXC as a circuit portion for driving the organic light emitting diode ED includes a first transistor T1 (or a switching transistor), a second transistor T2 (or a driving transistor), and a capacitor Cap. The pixel circuit PXC may be included in the circuit element layer DP-CL (see FIG. 5).

The organic light emitting device ED generates light by an electrical signal provided from the first and second transistors T1 and T2.

The first transistor T1 outputs a data signal applied to the data line DL in response to a gate signal applied to the gate line GL. The capacitor Cap charges a voltage corresponding to a data signal received from the first transistor T1. The first power supply voltage ELVDD is provided to the first electrode AE through the second transistor T2 and the second power supply voltage ELVSS is provided to the second electrode CE. The second power supply voltage ELVSS may have a lower level than the first power supply voltage ELVDD.

The second transistor T2 is electrically connected to the organic light emitting diode ED through the first electrode AE. The second transistor T2 controls the driving current ID flowing to the organic light emitting element ED in correspondence to the amount of charge stored in the capacitor Cap. The organic light emitting element ED may emit light during a turn-on section of the second transistor T2.

Figure 4A:
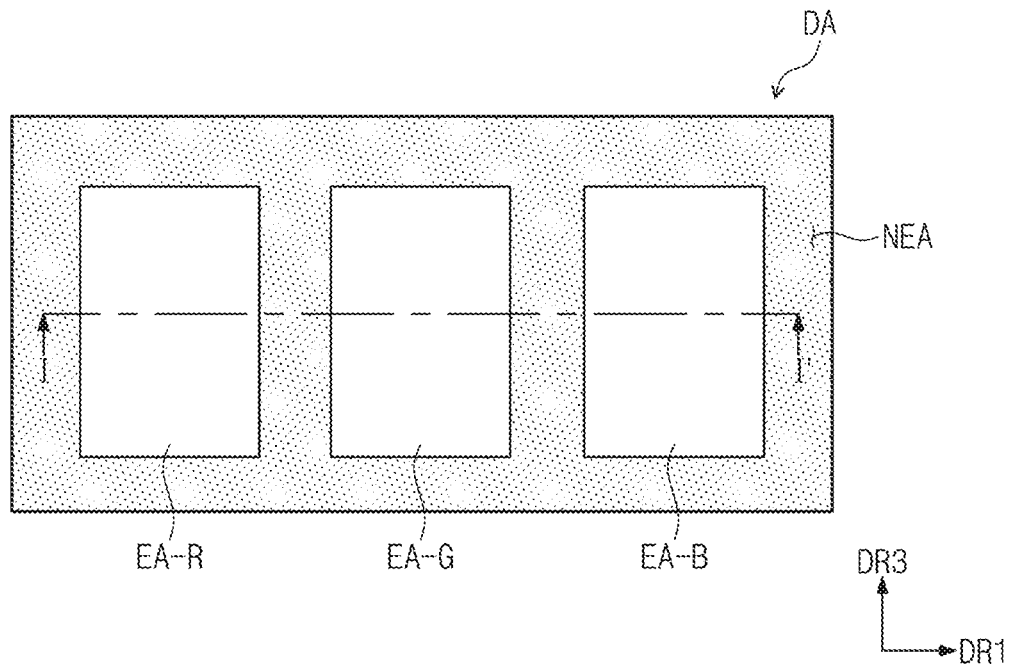
FIG. 4A is a plan view of light emitting areas of a display panel according to an exemplary embodiment of the invention.
Figure 4B:
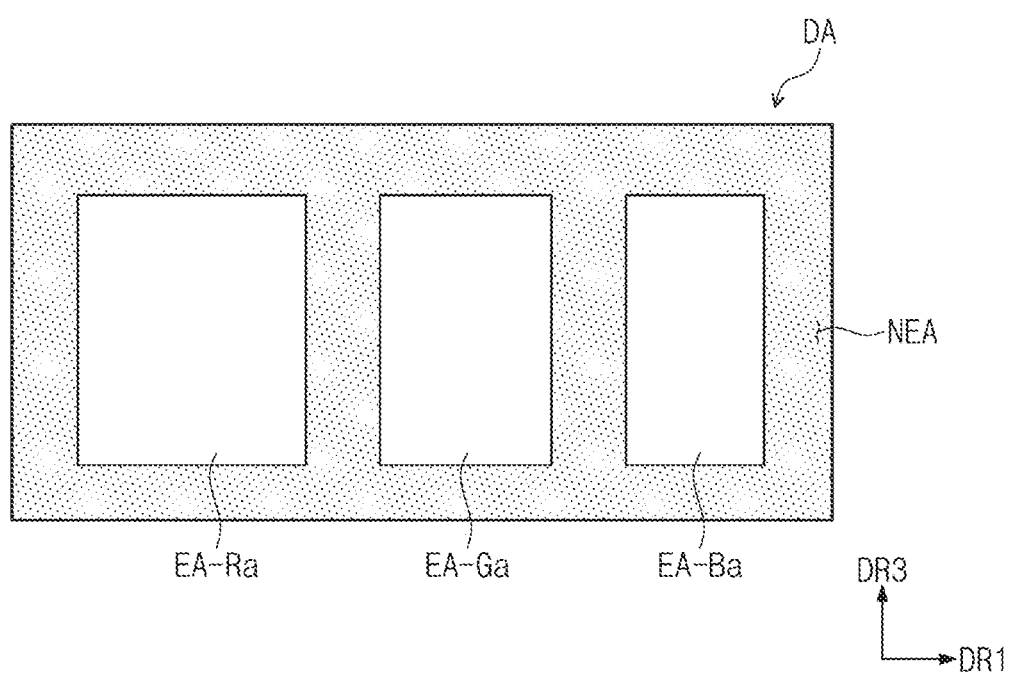
FIG. 4B is a plan view of light emitting areas of a display panel according to another exemplary embodiment of the invention.

FIG. 4A is a plan view of light emitting areas of a display panel according to an exemplary embodiment of the invention. FIG. 4B is a plan view of light emitting areas of a display panel according to another exemplary embodiment of the invention.

FIG. 4A is an enlarged view of a portion of the display area DA shown in FIG. 1. Three kinds of pixel areas EA-R, EA-G, and EA-B are mainly shown. The three kinds of pixel areas EA-R, EA-G, and EA-B shown in FIG. 4A may be repeatedly arranged over the entire display area DA.

A light shielding area NEA is disposed around the first to third pixel areas EA-R, EA-G, and EA-B. The first to third pixel areas EA-R, EA-G, and EA-B and the light shielding area NEA may be substantially defined in the second display substrate 200.

The first to third pixel areas EA-R, EA-G, and EA-B may be a light outgoing area in which an image is substantially viewed from the outside.

Among the first to third pixel areas EA-R, EA-G, and EA-B, the first pixel area EA-R provides the light of the second color to the outside, the second pixel area EA-G provides light of a third color different from the second color to the outside, and the third pixel area EA-B provides light of the first color to the outside. Here, the outside may be a space in which the image is directly viewed by the user.

According to an exemplary embodiment of the invention, the first pixel area EA-R outputs red light corresponding to the second color, the second pixel area EA-G outputs green light corresponding to the third color, and the third pixel area EA-B may provide blue light corresponding to the first color. According to the inventive concept, the source light may be blue light, which is the first color light. The source light may be generated in a light source such as a backlight unit provided in a liquid crystal display, or may be generated in a display element, such as a light emitting diode provided in an organic light emitting display.

The light shielding area NEA sets the boundaries of the first to third pixel areas EA-R, EA-G, and EA-B to prevent color mixing between the first to third pixel areas EA-R, EA-G, and EA-B. Also, the light shielding area NEA blocks the source light so that the source light is not provided to the user.

The first to third pixel areas EA-R, EA-G, and EA-B having the same area on a plane are exemplarily shown in FIG. 4A. However, the inventive concept is not limited thereto.

Referring to FIG. 4B, the first to third pixel areas EA-Ra, EA-Ga, and EA-Ba may have different areas, or at least two pixel areas may have different areas. In addition, although the first to third pixel areas EA-R, EA-G, and EA-B of a rectangular form are shown in FIGS. 4A and 4B, the inventive concept is not limited thereto. On a plane, the first to third pixel areas EA-R, EA-G, and EA-B may have another polygonal image, and the corner area may have a rectangular shape or a round regular shape.

Figure 6A:
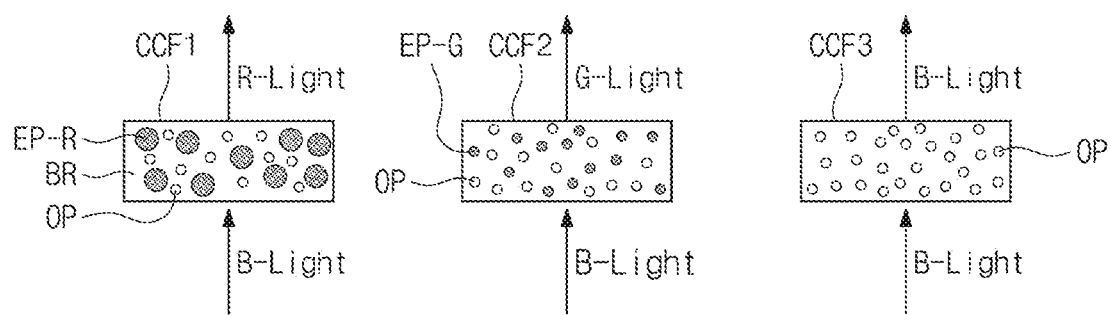
FIG. 6A is a view schematically illustrating optical characteristics of a conversion unit according to an exemplary embodiment of the invention.

FIG. 5 is a cross-sectional view taken along line I-I' of FIG. 4A according to another exemplary embodiment of the invention. FIG. 6A is a view schematically illustrating optical characteristics of a conversion unit according to an exemplary embodiment of an invention. FIG. 6B is a graph showing a wavelength range of light passing through a nano particle layer according to an exemplary embodiment of the invention.

Referring to FIG. 5, the display panel DP includes a first display substrate 100 and a second display substrate 200. The first display substrate 100 includes a first base substrate BS1, a circuit element layer DP-CL, a display element layer DP-OLED, and a cover layer CY.

The first base substrate BS1 may include a synthetic resin substrate or a glass substrate. The circuit element layer DP-CL includes at least one insulating layer and circuit element. The circuit element includes a signal line and a pixel circuit PXC or the like, as shown in FIG. 3B. A circuit element layer DP-CL may be formed through a formation process of an insulating layer, a semiconductor layer, and a conductive layer by coating, a deposition, and the like, and a patterning process of an insulating layer, a semiconductor layer, and a conductive layer by a photolithography process.

The circuit element layer DP-CL may include a buffer film BFL, a first insulating layer 10, a second insulating layer 20, a third insulating layer 30, and first to third driving transistors T2-1, T2-2, and T2-3. The first insulating layer 10 and the second insulating layer 20 according to the inventive concept may be inorganic films and the third insulating layer 30 may be an organic film.

The first driving transistor T2-1 includes a first semiconductor pattern OSP1, a first control electrode GE1, a first input electrode DE1, and a first output electrode SE1. The second driving transistor T2-2 includes a second semiconductor pattern OSP2, a second control electrode GE2, a second input electrode DE2, and a second output electrode SE2. The third driving transistor T2-3 includes a third semiconductor pattern OSP3, a third control electrode GE3, a third input electrode DE3, and a third output electrode SE3.

The first semiconductor pattern OSP1, the second semiconductor pattern OSP2, and the third semiconductor pattern OSP3 are disposed on the buffer film BFL disposed on the first base substrate BS1. The first insulating layer 10 covers the first semiconductor pattern OSP1, the second semiconductor pattern OSP2, and the third semiconductor pattern OSP3, and is disposed on the buffer film BFL.

The first control electrode GE1, the second control electrode GE2, and the third control electrode GE3 overlap the first semiconductor pattern OSP1, the second semiconductor pattern OSP2, the third semiconductor pattern OSP3, respectively, and are disposed on the first insulating layer 10. The second insulating layer 20 covers the first control electrode GE1, the second control electrode GE2, and the third control electrode GE3, and is disposed on the first insulating layer 10.

The first input electrode DE1 and the first output electrode SE1 are disposed on the second insulation layer 20 and are connected to the first semiconductor pattern OSP1 through a first through-hole CH1 and a second through-hole CH2 penetrating the first insulating layer 10 and the second insulating layer 20, respectively.

The second input electrode DE2 and the second output electrode SE2 are disposed on the second insulation layer 20 and are connected to the second semiconductor pattern OSP2 through a fourth through-hole CH4 and a fifth through-hole CH5 penetrating the first insulating layer 10 and the second insulating layer 20, respectively.

The third input electrode DE3 and the third output electrode SE3 are disposed on the second insulation layer 20 and are connected to the third semiconductor pattern OSP3 through a seventh through-hole CH7 and an eighth through-hole CH8 penetrating the first insulating layer 10 and the second insulating layer 20, respectively.

The third insulating layer 30 covers the first to third input electrodes DE1, DE2, and DE3 and the first to third output electrodes SE1, SE2 and SE3, and is disposed on the second insulating layer 20. A display element layer DP-OLED may be disposed on the third insulating layer 30.

The display element layer DP-OLED includes first to third light emitting elements OLED-B1, OLED-B2, and OLED-B3. According to an embodiment of the inventive concept, each of the first to third light emitting elements OLED-B1, OLED-B2, and OLED-B3 may include an organic light emitting element that generates light of a first color, that is, blue light.

The first light emitting element OLED-B1 includes a first sub-electrode AE1, a second electrode CE, a first hole control layer HCL1, a first electron control layer ECL1, and a first light emitting layer ENL1. The first sub-electrode AE1 is disposed on the third insulating layer (30). The first sub-electrode AE1 is connected to the first output electrode SE1 through a third through-hole CH3 passing through the third insulating layer 30. A light emitting opening part OM is defined in the pixel defining layer PDL. Hereinafter, in this specification, the light emitting opening part OM refers to an area where light is emitted through a light emitting element.

The first hole control layer HCL1 may include a hole transport layer and may further include a hole injection layer. A first light emitting layer ENL1 is disposed on the first hole control layer HCL1. The first light emitting layer ENL1 may be disposed in an area corresponding to the light emitting opening part OM. The first light emitting layer ENL may output the first color light. A first electron control layer ECL1 is disposed on the first light emitting layer ENL. The first electron control layer ECL1 may include an electron transport layer and may further include an electron injection layer. The second light emitting element OLED-B2 includes a second sub-electrode AE2, a second electrode CE, a second hole control layer HCL2, a second electron control layer ECL2, a second light emitting layer ENL2. The second sub-electrode AE2 disposed on the third insulating layer 30 is connected to the second output electrode SE2 through the sixth through-hole CH6. The second hole control layer HCL2 may be provided integrally with the first hole control layer HCL1 and the second electron control layer ECL2 may be provided integrally with the first electron control layer ECL1.

The third light emitting element OLED-B3 includes a third sub-electrode AE3, a second electrode CE, a third hole control layer HCL3, a third electron control layer ECL3, a third light emitting layer ENL3. The third sub-electrode AE3 disposed on the third insulating layer 30 is connected to the third output electrode SE3 through the ninth through hole CH9. The third hole control layer HCL3 may be provided integrally with the first hole control layer HCL1 and the third electron control layer ECL3 may be provided integrally with the first electron control layer ECL1.

The structure of the second light emitting element OLED-B2 and the third light emitting element OLED-B3 may be substantially the same as the structure of the first light emitting element OLED-B1.

According to an exemplary embodiment of the invention, the first to third light emitting layers ENL1, ENL2, and ENL3 may be provided in an integral form. That is, the first to third light emitting layers ENL1, ENL2, and ENL3 may be continuously disposed on the first to third sub-electrodes AE1, AE2, and AE3. Also, the second electrode CE may be provided in an integral form, and may be disposed continuously on the first to third light emitting layers ENL1, ENL2, and ENL3.

The cover layer CY may be disposed on the second electrode CE. The cover layer CY may include an organic material or an inorganic material. In an exemplary embodiment, the cover layer CY may be omitted.

The second display substrate 200 includes a second base substrate BS2, a light control layer CCL, a low refractive layer LY, a nano particle layer FY, a color filter layer including color filters CF1, CF2, CF3, an upper insulating layer IY, and a black matrix BM.

The second base substrate BS2 includes a synthetic resin substrate or a glass substrate and may face the first base substrate BS1 in the third direction DR3.

The light control layer CCL may include a illuminant that is disposed on the second base substrate BS2 and absorbs the first color light outputted from the display element layer DP-OLED and emits a color different from the first color.

The light control layer CCL includes a first conversion part CCF1, a second conversion part CCF2, and a transmission part CCF3.

The first conversion part CCF1 converts the first color light emitted from the first light emitting element OLED-B1 into a light of a second color different from the first color, and emits it to the outside through the first pixel area EA-R.

The second conversion part CCF2 converts the first color light emitted from the second light emitting element OLED-B2 into a third color light, and emits it to the outside through the second pixel area EA-G.

The transmission part CCF3 transmits the first color light and emits it to the outside through the third pixel area EA-B.

The black matrix BM may be disposed between the first conversion part CCF1, the second conversion part CCF2, and the transmission part CCF3 on a plane. As an example, the black matrix BM may be disposed directly on the nano particle layer FY and may overlap the light shielding area NEA.

Referring to FIG. 6A, the first illuminant EP-R absorbs the first color light, which is blue light, and emits the second color light, which is red light, and the second illuminant EP-G absorbs the first color light and emits the third color light, which is green light. The transmission part CCF3 may be a part that does not contain a illuminant. The transmission part CCF3 may be a part that transmits the first color light.

In addition, the first conversion part CCF1, the second conversion part CCF2, and the transmission part CCF3 may include a base resin BR. The base resin BR may be a polymer resin. For example, the base resin BR may be an acrylic resin, a urethane resin, a silicone resin, an epoxy resin, or the like. The base resin BR may be a transparent resin.

In addition, each of the first conversion part CCF1, the second conversion part CCF2, and the transmission part CCF3 may further include a scattering particle OP. The scattering particles OP may be TiO2 or silica-based nanoparticles. The scattering particle OP may scatter light emitted from a phosphor and emit it to the outside of the conversion part. Also, in the case of transmitting the provided light as it is like the transmission part CCF3, the scattering particle OP may scatter the provided light and emit it to the outside.

The first and second illuminants EP-R and EP-G included in the color control layer CCL may be fluorescent substances or quantum dots. In other words, in an exemplary embodiment, the color control layer CCL may include at least one of the fluorescent substances or the quantum dots as the illuminants EP-R and EP-G.

For example, the fluorescent substances used as the illuminants EP-R and EP-G may be inorganic fluorescent substances. In the display device DD according to an exemplary embodiment, the fluorescent substances used as the illuminants EP-R and EP-G may be a red fluorescent substance and a green fluorescent substance.

The green fluorescent substance may include at least one selected from a group consisting of YBO3:Ce3+,Tb3+, BaMgAl10O17:Eu2+, Mn2+, (Sr,Ca,Ba)(Al,Ga)2S4:Eu2+; ZnS:Cu,Al, Ca8Mg(SiO4)4Cl2: Eu2+, Mn2+; Ba2SiO4: Eu2+; (Ba,Sr)2SiO4:Eu2+; Ba2(Mg, Zn)Si2O7:Eu2+; (Ba, Sr)Al2O4:Eu2+, Sr2Si3O8.2SrCl2:Eu2+.

The red fluorescent substance may include at least one selected from a group consisting of (Sr,Ca,Ba,Mg)P2O7: Eu2+, Mn2+, CaLa2S4:Ce3+; SrY2S4: Eu2+, (Ca,Sr)S: Eu2+, SrS:Eu2+, Y2O3: Eu3+,Bi3+; YVO4: Eu3+,Bi3+; Y2O2S: Eu3+,Bi3+; Y2O2S: Eu3+.

However, the kinds of the fluorescent substances used in the color control layer CCL are not limited to the materials described above. In other words, the fluorescent substances may use other known fluorescent substances in addition to the fluorescent substance materials described above.

In other exemplary embodiments, the illuminants EP-R and EP-G included in the color control layer CCL may be the quantum dots. The quantum dot may be formed of a group II-VI compound, a group III-V compound, a group IV-VI compound, a group IV element, a group IV compound, or any combination thereof.

The group II-VI compound may be selected from a group consisting of a binary compound selected from a group consisting of CdSe, CdTe, ZnS, ZnSe, ZnTe, ZnO, HgS, HgSe, HgTe, MgSe, MgS, and any mixture thereof; a ternary compound selected from a group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any mixture thereof; and a quaternary compound selected from a group consisting of HgZnTeS, CdZnSeS, CdZnSeTe, CdZnSTe, CdHgSeS, CdHgSeTe, CdHgSTe, HgZnSeS, HgZnSeTe, HgZnSTe, and any mixture thereof.

The group III-V compound may be selected from a group consisting of a binary compound selected from a group consisting of GaN, GaP, GaAs, GaSb, AlN, AlP, AlAs, AlSb, InN, InP, InAs, InSb, and any mixture thereof; a ternary compound selected from a group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and any mixture thereof; and a quaternary compound selected from a group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any mixture thereof.

The group IV-VI compound may be selected from a group consisting of a binary compound selected from a group consisting of SnS, SnSe, SnTe, PbS, PbSe, PbTe, and any mixture thereof; a ternary compound selected from a group consisting of SnSeS, SnSeTe, SnSTe, PbSeS, PbSeTe, PbSTe, SnPbS, SnPbSe, SnPbTe, and any mixture thereof; and a quaternary compound selected from a group consisting of SnPbSSe, SnPbSeTe, SnPbSTe, and any mixture thereof. The group IV element may be selected from a group consisting of Si, Ge, and a mixture thereof. The group IV compound may be a binary compound selected from a group consisting of SiC, SiGe, and a mixture thereof.

In these cases, the binary compound, the ternary compound, or the quaternary compound may exist in the quantum dot with a substantially uniform concentration. Alternatively, a concentration of the binary compound, the ternary compound or the quaternary compound in a portion of the quantum dot may be different from that of the binary compound, the ternary compound or the quaternary compound in another portion of the quantum dot.

The quantum dot may have a core-shell structure including a core and a shell surrounding the core. Alternatively, the control part may have a core/shell structure in which one quantum dot surrounds another quantum dot. An interface of the core and the shell may have a concentration gradient in which a concentration of an element existing in the shell becomes progressively less toward a center.

The quantum dot may be a nano-sized particle. The quantum dot may have a full width of half maximum (FWHM) of an emission wavelength spectrum that is about 45 nm or less (in particular, about 40 nm or less, and in more particular, about 30 nm or less), and color purity and/or color reproduction can be improved in the range. In addition, light emitted through the quantum dot may be emitted in all directions, and thus a relatively wide viewing angle can be improved or realized.

Furthermore, a shape of the quantum dot may be a general shape known in the art but the shape thereof is not so limited. For example, the quantum dot may have a spherical shape, a pyramidal shape, a multi-arm shape, a cubic nanoparticle shape, a nanotube shape, a nanowire shape, a nanofiber shape, or a nano-plate particle shape.

According to the inventive concept, the quantum dot may change the color of light emitted according to the particle size. When the first illuminant EP-R and the second illuminant EP-G are quantum dots, the particle size of the first illuminant EP-R and the particle size of the second illuminant EP-G may be different from each other. For example, the particle size of the first illuminant EP-R may be larger than that of the second illuminant EP-G. At this time, the first illuminant EP-R may emit light of a longer wavelength than the second illuminant EP-G.

Referring again to FIG. 5, a low refractive layer LY may be disposed between the light control layer CCL and the second base substrate BS2. The low refractive layer LY may be disposed directly on the light control layer CCL.

According to an exemplary embodiment of the invention, the refractive index of the light control layer CCL may be higher than that of the low refractive layer LY. That is, the refractive index of the base resin BR included in the first conversion part CCF1, the second conversion part CCF2, and the transmission part CCF3 may be higher than the refractive index of the low refractive layer LY. Due to the refractive index difference between the low refractive layer LY and the light control layer CCL, a portion of the light outputted from the first conversion part CCF1, the second conversion part CCF2, and the transmission part CCF3 may be totally reflected at the interface of the low refractive layer LY. As a result, the totally-reflected light may be scattered again by the scattering particles OP described with reference to FIG. 6A and may be emitted to the outside. As described above, by the low refractive layer LY, the characteristics of the light emitted from the first conversion part CCF1, the second conversion part CCF2, and the transmission part CCF3 may be improved.

The upper insulating layer IY covers the first conversion part CCF1, the second conversion part CCF2, and the transmission part CCF3, and may be disposed on the low refractive layer LY.

As an example, the color filter layer including color filters CF1, CF2, Cf3 may be disposed between the nano particle layer FY and the low refractive layer LY. As another example, when the low refractive layer LY is omitted, the color filter layer may be disposed between the nano particle layer FY and the light control layer CCL. The first to third color filters CF1 to CF3 receive the light transmitted through the first conversion part CCF1, the second conversion part CCF2, and the transmission part CCF3 and deliver the light to the second base substrate BS2.

In detail, the first color filter CF1 may be provided with substantially the same red color as the second color. The first color filter CF1 receives the second color light through the first conversion part CCF1 and outputs the received second color light to the outside through the second base substrate BS2 overlapping the first pixel area EA-R.

The second color filter CF2 may be provided with substantially the same green color as the third color. The second color filter CF2 receives the third color light through the second conversion part CCF2 and outputs the received third color light to the outside through the second base substrate BS2 overlapping the second pixel area EA-G.

The third color filter CF3 may be provided with substantially the same blue color as the first color. The third color filter CF3 receives the first color light through the transmission part CCF3 and outputs the received first color light to the outside through the second base substrate BS2 overlapping the third pixel area EA-B.

On the other hand, a portion of the first color light provided from the first light emitting element OLED-B1 may be transmitted to the outside as it is without being absorbed by the first illuminant EP-R (see FIG. 6A). If the first color filter CF1 is omitted, a portion of the first color light may be emitted to the outside through the second base substrate BS2. As a result, the first color light and the second color light are partially mixed, so that the display quality of the image may be reduced.

However, as shown in FIG. 5, as the first color filter CF1 of the inventive concept absorbs the first color light transmitted through the first conversion part CCF1, the first color light may not be delivered to the second base substrate BS2 through the first color filter CF1. Accordingly, the second color light emitted through the first conversion part CCF1 may be outputted through the second base substrate BS2 without mixing with other colors. As a result, the color visibility may be improved.

Further, the display panel DP according to the inventive concept may receive external light from the outside. External light may have various wavelength ranges. The external light may be incident through the second base substrate BS2, and may be reflected by the first conversion part CCF1, the second conversion part CCF2, and the transmission part CCF3, and may be re-emitted toward the second base substrate BS2.

For example, when the first color filter CF1 is omitted, the external light may be reflected and scattered by the first conversion part CCF1 and mixed with the second color light outputted from the first conversion part CCF1. As a result, the external light and the second color light are partially mixed, so that the display quality of the image may be reduced. Also, the first illuminant EP-R included in the first conversion part CCF1 is emitted by the external light, so that the second color light may be outputted to the outside. As a result, the second color light is visually recognized by the external light, so that the display quality of the image may be reduced.

However, the first color filter CF1 of the inventive concept may transmit only the component having the wavelength range of the second color among the components of the external light, and may absorb the color of the remaining wavelength range. As a result, the first color filter CF1 may transmit only the light having the wavelength range of the second color in the external light to the first conversion part CCF1. Accordingly, as the light having the wavelength range of the second color is outputted toward the second base substrate BS2 by the first conversion part CCF1, the display quality of the image may be improved.

In the same manner, the second color filter CF2 of the inventive concept may transmit only the component having the wavelength range of the third color among the components of the external light, and may absorb the color of the remaining wavelength range. As a result, the second color filter CF2 may transmit only the light having the wavelength range of the third color in the external light to the second conversion part CCF2. Accordingly, as the light having the wavelength range of the third color is outputted toward the second base substrate BS2 by the second conversion part CCF2, the display quality of the image may be improved.

In the same manner, the third color filter CF3 of the inventive concept may transmit only the component having the wavelength range of the first color among the components of the external light, and may absorb the color of the remaining wavelength range. As a result, the third color filter CF3 may transmit only the light having the wavelength range of the first color in the external light to the transmission part CCF3. Accordingly, as the light having the wavelength range of the first color is outputted toward the second base substrate BS2 by the transmission part CCF3, the display quality of the image may be improved.

FIG. 6B is a graph showing wavelength characteristics of red, green, and blue. The horizontal axis of the graph shows the wavelength range in nanometers (nm). As an example, the blue color has a wavelength range of about 400 to about 520. The green color has a wavelength range of about 450 to about 620. The red color has a wavelength range of about 600 to about 700.

On the other hand, the wavelength range of the second color (Red) and the wavelength range of the third color (Green) may overlap in the first area AA. The wavelength range of the first color (Blue) and the wavelength range of the third color (Green) may overlap in the second area BB. Here, overlapping means that the two colors have the same wavelength range.

For example, light having a wavelength range of the third color in the external light may not be totally absorbed by the first color filter CF1, and a portion of the light may transmit the first color filter CF1. Here, a portion of the third color light is described as the first light having the wavelength range of the first area AA. In this case, the first light is supplied to the first conversion part CCF1, and the first illuminant EP-R emits light. As a result, the after-image of the second color may reduce the display quality.

For example, light having a wavelength range of the first color in the external light may not be totally absorbed by the second color filter CF2, and a portion of the light may transmit the second color filter CF2. Here, a portion of the first color light is described as the second light having the wavelength range of the second area BB. In this case, the second light is supplied to the second conversion part CCF2, and the second illuminant EP-G emits light. As a result, the after-image of the third color may reduce the display quality.

According to the inventive concept, a nano particle layer FY may be disposed between the second base substrate BS2 and the color filters CF1, CF2, and CF3. The nano particle layer FY may absorb light corresponding to the overlapped wavelength range of the two colors among the first to third colors described above.

The nano particle layer FY may absorb the first light having an overlapping wavelength range of the wavelength range of the first color and the wavelength range of the third color and the second light having an overlapping wavelength range of the wavelength range of the second color and the wavelength range of the third color. Therefore, the external light transmitted through the nano particle layer FY may have a wavelength in which the wavelength ranges of the first area AA and the second area BB are removed.

For example, as the external light passes through the nano particle layer FY, the component of the first light corresponding to the first area AA of the light having the wavelength range of the third color may be removed. That is, the light in the wavelength range of the third color where the component of the first light is removed may be totally absorbed by the first color filter CF1. As a result, the first illuminant EP-R included in the first conversion part CCF1 may not emit light of the second color by the external light.

For example, as the external light passes through the nano particle layer FY, the component of the second light corresponding to the second area BB of the light having the wavelength range of the first color may be removed. That is, the light in the wavelength range of the first color where the component of the second light is removed may be totally absorbed by the second color filter CF2. As a result, the second illuminant EP-G included in the second conversion part CCF2 may not emit light of the third color by the external light.

Figure 7:
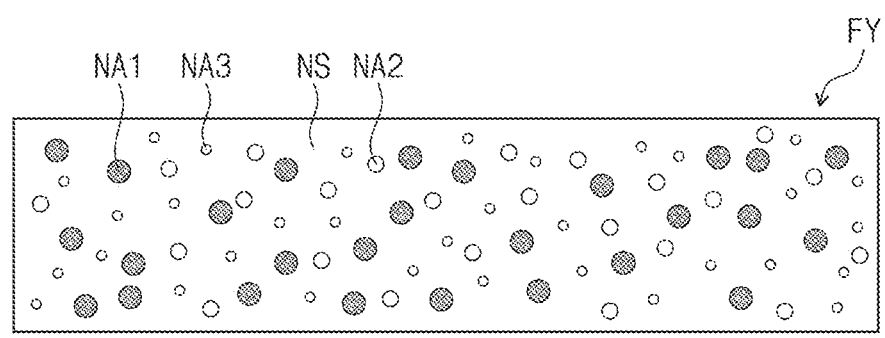
FIG. 7 is a cross-sectional view illustrating a nanoparticle layer according to an exemplary embodiment of the invention.

FIG. 7 is a cross-sectional view illustrating a nano particle layer according to an exemplary embodiment of the invention.

Referring to FIG. 7, the nano particle layer FY includes an upper base resin NS, a plurality of first nanoparticles NA1, a plurality of second nanoparticles NA2, and a plurality of third nanoparticles NA3. The upper base resin NS may be a polymer resin. For example, the upper base resin NS may be an acrylic resin, a urethane resin, a silicone resin, an epoxy resin, or the like. The upper base resin NS may be a transparent resin. The first to third nanoparticles NA1, NA2, and NA3 may be included in the upper base resin NS.

According to an exemplary embodiment of the invention, the first nanoparticles NA1 may absorb the first light corresponding to the wavelength range of the first area AA described with reference to FIG. 6B. That is, the first nanoparticles NA1 may absorb light in the overlapped wavelength range between the second color light corresponding to red and the third color light corresponding to green.

According to an exemplary embodiment of the invention, the second nanoparticles NA2 may absorb the second light corresponding to the wavelength range of the second area BB described with reference to FIG. 6B. That is, the second nanoparticles NA2 may absorb light in the overlapped wavelength range between the first color light corresponding to blue and the third color light corresponding to green.

According to the exemplary embodiment of the invention, the third nanoparticles NA3 may absorb the third light in the wavelength range shorter than the wavelength range of the first color. That is, the third nanoparticles NA3 may absorb light corresponding to a wavelength range shorter than the blue wavelength.

In particular, the first to third nanoparticles NA1, NA2, and NA3 may be provided with different diameters, i.e., different sizes. For example, the diameter of the first nanoparticles NA1 may be greater than the diameter of the second nanoparticles NA2, and the diameter of the second nanoparticles NA2 may be greater than the diameter of the third nanoparticles NA3.

For example, the first nanoparticle NA1 and the second nanoparticle NA2 may be provided as a porphyrin-based structure. Further, the third nanoparticle NA3 may be provided as a chlorine-based structure.

As described above, the nano particle layer FY according to the inventive concept may remove a specific wavelength range of external light transmitted to the light control layer CCL. Thus, after-image or reflection due to light emitted from the light control layer CCL may be reduced by light in a specific wavelength range. As a result, the overall visibility of the display device DD may be improved, and the display quality may be improved.

Figure 8:
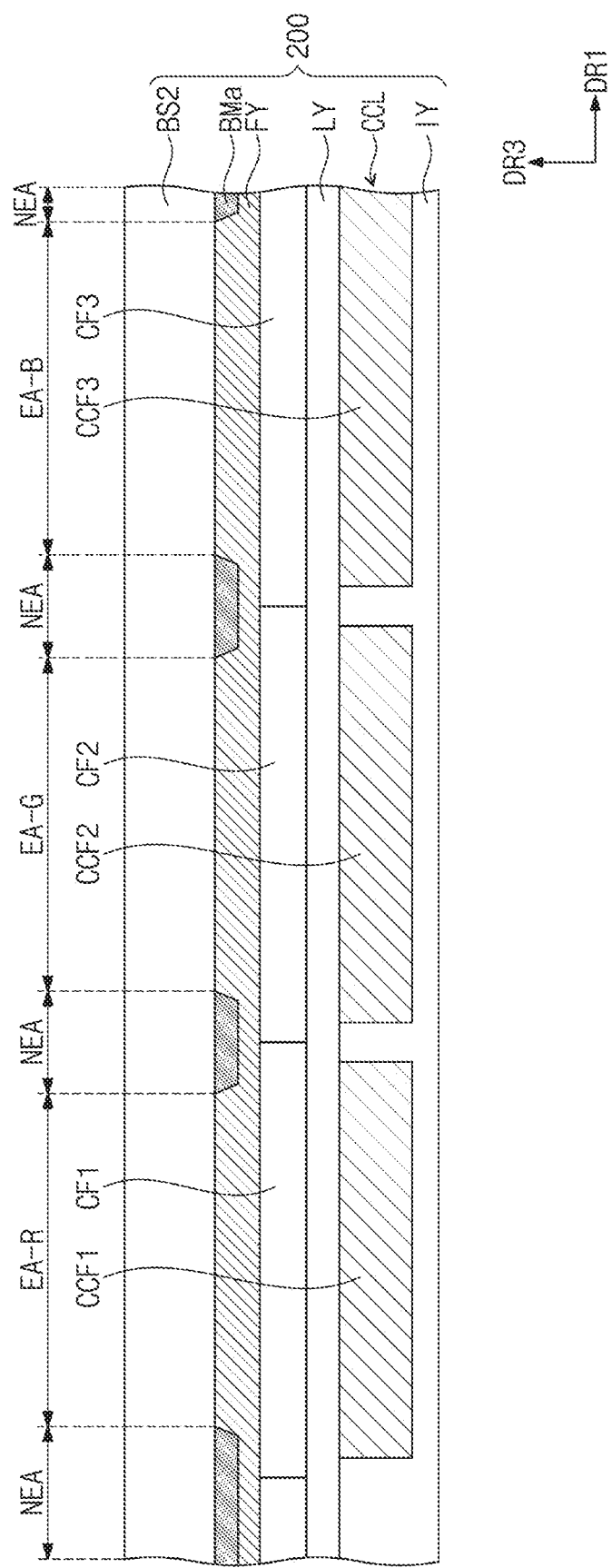
FIG. 8 is a cross-sectional view taken along line I-I' of FIG. 4A according to another exemplary embodiment of the invention.

FIG. 8 is a cross-sectional view taken along line I-I' of FIG. 4A according to another exemplary embodiment of the invention.

As compared to the second display substrate 200 shown in FIG. 5, in relation to the second display substrate 200 shown in FIG. 8, only the arrangement relationship of the black matrix BMa is changed, and the remaining configurations and structures may be substantially the same. Therefore, for convenience of explanation, only the structure of the black matrix BMa will be mainly described with reference to FIG. 8.

Referring to FIG. 8, the black matrix BMa may be disposed directly on the second base substrate BS2. The black matrix BMa may be disposed between the first conversion part CCF1, the second conversion part CCF2, and the transmission part CCF3 on a plane. In practice, the light shielding area NEA may be partitioned by the black matrix BMa.

The nano particle layer FY covers the black matrix BMa and may be disposed on a second base substrate BS2.

Figure 9:
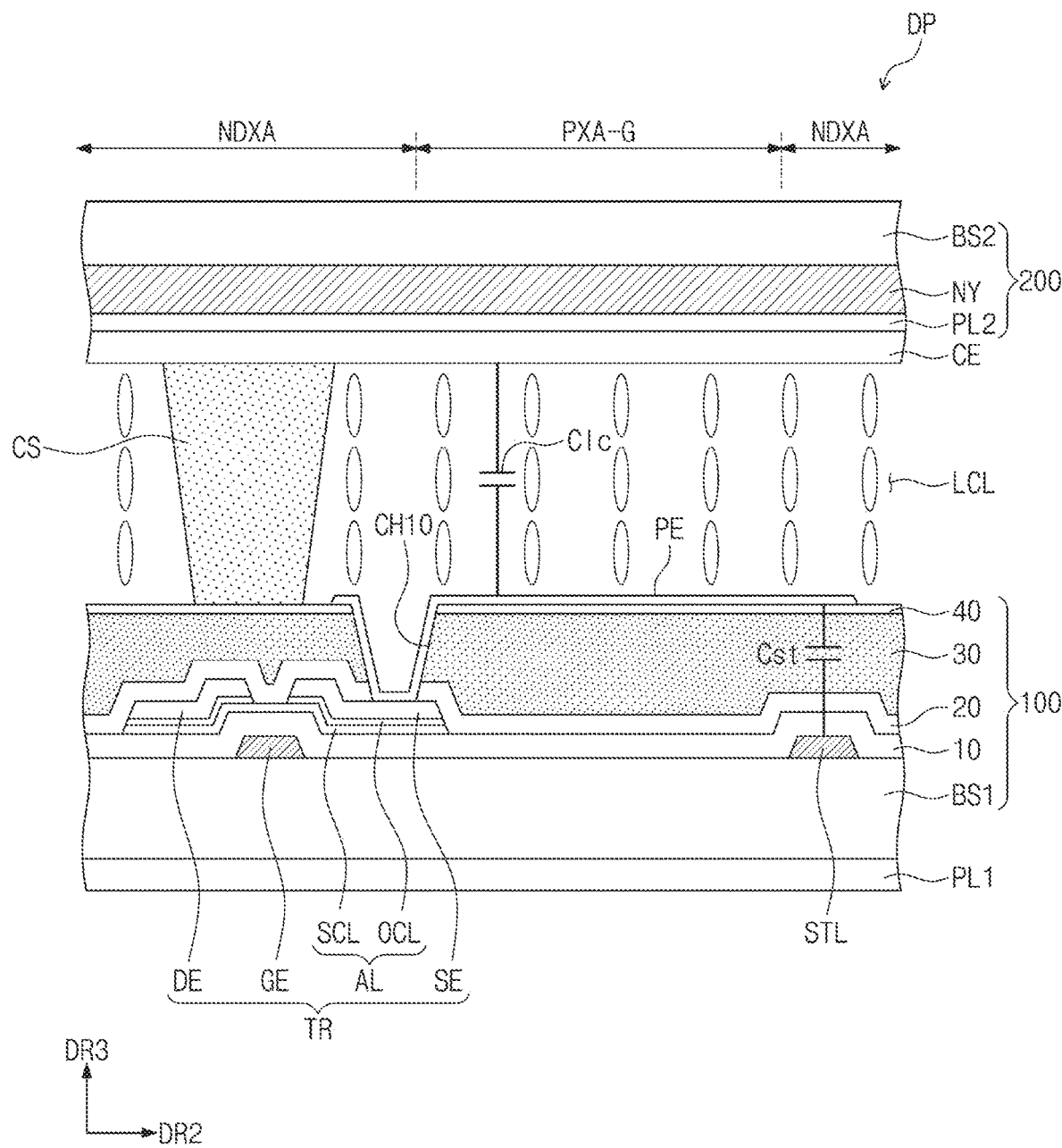
FIG. 9 is a partial cross-sectional view of a display panel according to another exemplary embodiment of the invention.

FIG. 9 is a partial cross-sectional view of a display panel according to another exemplary embodiment of the invention.

The pixel of the liquid crystal display panel DP shown in FIG. 9 may include a transistor TR, a liquid crystal capacitor Clc, and a storage capacitor Cst in terms of an equivalent circuit.

The liquid crystal display panel DP includes a first display substrate 100, a second display substrate 200, and a liquid crystal layer LCL disposed therebetween. A spacer CS overlapping the light shielding area NPXA may be disposed between the first display substrate 100 and the second display substrate 200.

The liquid crystal display panel DP includes first and second polarizer layers PL1 and PL2. The first polarizer layer PL1 may be disposed on the lower side the first display substrate 100 and the second polarizer layer PL2 may constitute the second display substrate 200.

A control electrode GE and a storage line STL are disposed on one surface of the first base substrate BS1. The first base substrate BS1 may be a glass substrate or a plastic substrate. A first insulating layer 10 covering the control electrode GE and the storage line STL is disposed on one surface of a first base substrate BS1. The first insulating layer 10 may include at least one of an inorganic material and an organic material. An activation part AL overlapping the control electrode GE is disposed on the first insulating layer 10. The activation part AL may include a semiconductor layer SCL and an ohmic contact layer OCL. The semiconductor layer SCL is disposed on the first insulating layer 10 and the ohmic contact layer OCL is disposed on the semiconductor layer SCL.

The semiconductor layer SCL may include amorphous silicon or poly silicon. Additionally, the semiconductor layer SCL may include a metal oxide semiconductor. The ohmic contract layer OCL may include a dopant doped with higher density than the semiconductor layer. The ohmic contact layer OCL may include two separated portions. In an exemplary embodiment of the invention, the ohmic contact layer OCL may have an integral form.

The input electrode DE and the output electrode SE are disposed on the activation part AL. The input electrode DE and the output electrode SE are disposed apart from each other. A second insulating layer 20 covering the activation part AL, the input electrode DE, and the output electrode SE is disposed on the first insulating layer 10. The third insulating layer 30 is disposed on the second insulating layer 20, and the second insulating layer 20 and the third insulating layer 30 may include at least one of inorganic and organic materials. The third insulating layer 30 is disposed on the second insulating layer 20. The third insulating layer 30 may be an organic layer providing a flat surface. A fourth insulating layer 40 is disposed on the third insulating layer 30. The fourth insulating layer 40 may be an inorganic layer.

As shown in FIG. 9, the pixel electrode PE is disposed on the fourth insulating layer 40. The pixel electrode PE is connected to the output electrode SE through a through-hole CH10 penetrating the second insulating layer 20, the third insulating layer 30, and the fourth insulating layer 40. An alignment film (not shown) covering the pixel electrode PE may be disposed on the fourth insulating layer 40.

The second base substrate BS2 may be a glass substrate or a plastic substrate. The intermediate layer IL, the second polarizer layer PL2, and the common electrode CE are disposed on the lower surface of the second base substrate BS2. The liquid crystal layer LCL operates by the charging or discharging the liquid crystal capacitor Clc, and the source light provided from the backlight unit may be selectively provided to the intermediate layer IL through the first polarizer layer PL1, the liquid crystal layer LCL, and the second polarizer layer PL2.

In this exemplary embodiment, the intermediate layer IL is shown briefly, but the intermediate layer IL may have a laminated structure disposed on the lower surface of the second base substrate BS2 in FIG. 5.

On the other hand, the cross section shown in FIG. 9 is only an example. Although the liquid crystal display panel of the Vertical Alignment (VA) mode is exemplarily described, in other exemplary embodiments of the invention, a liquid crystal display panel of an in-plane switching (IPS) mode, a fringe-field switching (FFS) mode, a plane to line switching (PLS) mode, a super vertical alignment (SVA) mode, or a Surface-Stabilized Vertical Alignment (SS-VA) mode may be applied.

According to an exemplary embodiment of the invention, a display panel includes a nano particle layer that absorbs light corresponding to a wavelength band of two overlapping colors among a plurality of colors. Therefore, a predetermined range of wavelengths is removed from the external light transmitting the nano particle layer. As a result, the illuminant contained in the light control layer may be prevented from reacting by the external light.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising:
    first display substrate including first to third light emitting elements for outputting first color light; and
    a second display substrate including first to third pixel areas overlapping the first to third light emitting elements, respectively,
    wherein the second display substrate comprises:
    a base substrate;
    a light control layer disposed on the base substrate and including a first conversion part configured to convert the first color light into a second color light different from the first color light and emitting the second color light through the first pixel area, a second conversion part configured to convert the first color light into a third color light different from the second color light and emit the third color light through the second pixel area, and a transmission part configured to transmit the first color light and emit the first color light through the third pixel area; and
a nano particle layer disposed between the base substrate and the light control layer and configured to absorb at least one of a first light having an overlapping wavelength range of a wavelength range of the first color light and a wavelength range of the third color light and a second light having an overlapping wavelength range of a wavelength range of the second color light and a wavelength range of the third color light.

2. The display panel of claim 1, wherein:
the nano particle layer comprises at least one first nanoparticle and at least one second nanoparticle; and
the at least one first nanoparticle absorbs the first light and the at least one second nanoparticle absorbs the second light.

3. The display panel of claim 2, wherein the nano particle layer further comprises at least one third nanoparticle that absorbs third light in a wavelength range shorter than the wavelength range of the first color light.

4. The display panel of claim 2, wherein:
the nano particle layer further comprises a base resin filled with the at least one first nanoparticle and the at least one second nanoparticle; and
each of the at least one first nanoparticle and the at least one second nanoparticle overlaps the first to third pixel areas.

5. The display panel of claim 2, wherein a size of the at least one first nanoparticle is larger than a size of the at least one second nanoparticle.

6. The display panel of claim 1, wherein the first conversion part comprises a first illuminant and the second conversion part comprises a second illuminant.

7. The display panel of claim 6, wherein:
the first conversion part, the second conversion part, and the transmission part are spaced apart from each other on a plane of the second display substrate; and
on the plane, the second display substrate further comprises a black matrix disposed between the first conversion part and the second conversion part, between the second conversion part and the transmission part, and between the first conversion part and the transmission part.

8. The display panel of claim 1, wherein the second display substrate further comprises a color filter layer disposed between the nano particle layer and the light control layer.

9. The display panel of claim 8, wherein the second display substrate further comprises a low refractive layer disposed between the color filter layer and the light control layer.

10. The display panel of claim 9, wherein a refractive index of the light control layer is higher than a refractive index of the low refractive layer.

11. The display panel of claim 8, wherein the color filter layer comprises:
a first color filter overlapping the first pixel area;
a second color filter overlapping the second pixel area; and
a third color filter overlapping the third pixel area.

12. The display panel of claim 1, wherein the nano particle layer is disposed directly on the base substrate.

13. The display panel of claim 1, wherein the first color light is blue, the second color light is red, and the third color light is green.

14. The display panel of claim 1, wherein each of the first to third light emitting elements comprises a first electrode, a second electrode, and a light emitting layer disposed between the first electrode and the second electrode.

15. The display panel of claim 14, wherein the light emitting layers of the first through third light emitting elements are provided in an integral form.

16. The display panel of claim 1, wherein the first display substrate comprises:
a lower base substrate;
a circuit element layer disposed on the lower base substrate; and
a display element layer disposed on the circuit element layer and including the first to third light emitting elements.

17. A display panel comprising:
a first display substrate including a plurality of light emitting elements for outputting first color light; and
a second display substrate including a plurality of pixel areas overlapping the plurality of light emitting elements, respectively,
wherein the second display substrate comprises:
a base substrate;
a light control layer disposed on the base substrate and configured to convert the first color light into a second color light different from the first color light, and configured to convert the first color light into a third color light different from the second color light, and configured to transmit the first color light; and
a nano particle layer disposed between the base substrate and the light control layer and configured to absorb at least one of a first light having an overlapping wavelength range of a wavelength range of the first color light and a wavelength range of the third color light and a second light having an overlapping wavelength range of a wavelength range of the second color light and a wavelength range of the third color light.

18. The display panel of claim 17, wherein the nano particle layer comprises a first nanoparticle that absorbs the first light, a second nanoparticle that absorbs the second light, and a third nanoparticle that absorbs light in a wavelength range shorter than the first color light.

19. The display panel of claim 18, wherein a diameter of the first nanoparticle is larger than a diameter of the second nanoparticle and the diameter of the second nanoparticle is larger than a diameter of the third nanoparticle.

* * * * *